United States Patent
Song

(10) Patent No.: US 8,981,849 B2
(45) Date of Patent: Mar. 17, 2015

(54) BIAS CIRCUIT AND POWER AMPLIFIER WITH DUAL-POWER MODE

(71) Applicant: Samsung Electro-Mechanics Co., Ltd., Suwon (KR)

(72) Inventor: Young Jean Song, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 13/779,609

(22) Filed: Feb. 27, 2013

(65) Prior Publication Data

US 2014/0167861 A1 Jun. 19, 2014

(30) Foreign Application Priority Data

Dec. 14, 2012 (KR) .................. 10-2012-0146583

(51) Int. Cl.
  *H03F 3/04* (2006.01)
  *H03F 1/30* (2006.01)
  *H03F 3/24* (2006.01)

(52) U.S. Cl.
  CPC .............. *H03F 1/302* (2013.01); *H03F 3/245* (2013.01)
  USPC .......................................... 330/289; 330/285

(58) Field of Classification Search
  USPC .......................................... 330/289, 285, 296
  See application file for complete search history.

(56) References Cited

U.S. PATENT DOCUMENTS

| 7,417,507 | B2 * | 8/2008 | Yamamoto et al. ........... 330/296 |
| 7,504,887 | B2 | 3/2009 | Masuda et al. |
| 7,554,407 | B2 * | 6/2009 | Hau et al. ...................... 330/289 |
| 8,040,186 | B2 * | 10/2011 | Nakayama et al. ........... 330/285 |
| 2007/0236293 | A1 | 10/2007 | Masuda et al. |
| 2009/0212863 | A1 | 8/2009 | Ishimaru |

FOREIGN PATENT DOCUMENTS

| JP | 2007-306543 A | 11/2007 |
| JP | 2009-200770 A | 9/2009 |
| KR | 20050062733 A | 6/2005 |

OTHER PUBLICATIONS

Office Action issued on Jan. 20, 2014 in the corresponding Korean patent application No. 10-2012-0146583.

* cited by examiner

*Primary Examiner* — Henry Choe

(74) *Attorney, Agent, or Firm* — McDermott Will and Emery LLP

(57) ABSTRACT

There are provided a bias circuit and a power amplifier with a dual-power mode. The bias circuit includes a regulated voltage generation unit generating a regulated voltage by using a reference voltage, a bias voltage generation unit generating a bias voltage according to the regulated voltage, and a power mode control unit operating in any one of a high power mode and a low power mode according to a power mode voltage and dropping the regulated voltage in the low power mode.

12 Claims, 4 Drawing Sheets

BIAS CIRCUIT AND POWER AMPLIFIER WITH DUAL-POWER MODE

CROSS-REFERENCE TO RELATED APPLICATIONS

This application claims the priority of Korean Patent Application No. 10-2012-0146583 filed on Dec. 14, 2012, in the Korean Intellectual Property Office, the disclosure of which is incorporated herein by reference.

BACKGROUND OF THE INVENTION

1. Field of the Invention

The present invention relates to a bias circuit and a power amplifier with a dual-power mode applicable to a wireless communications system.

2. Description of the Related Art

In general, a wireless communications scheme is a digital modulation/demodulation scheme having an appropriate scheme in terms of frequency usage efficiency enhancement employed therein. For example, a cell phone based on a code division multiple access (CDMA) scheme employs a quadrature phase shift keying (QPSK) scheme, and a wireless local area network (WLAN) following the IEEE (Institute of Electrical and Electronics Engineers) 802.11 communications standard employs an orthogonal frequency division multiplexing (OFDM) digital modulation scheme.

A wireless communications system employing a wireless communications scheme includes a power amplifier amplifying power of a transmission signal.

Here, a system requiring linear amplification requires a power amplifier having linearity in order to amplify a transmission signal without distortion. Here, linearity refers to characteristics in which, even in the case that power of an input signal is changed, power of an output signal is amplified at a predetermined ratio and a phase thereof is not changed.

Also, in order to increase usage time of a device with limited battery capacity, a technique of increasing efficiency by significantly reducing power consumption of components therein is required for a wireless communications device.

An existing power amplifier provides a bias voltage generated by a bias circuit to a power amplification device through a resistor. Here, the bias circuit may have a temperature compensation function.

However, since existing, already designed, power amplifiers, in the design thereof provide a fixed bias voltage, not allowing for a high power mode or a low power mode to be selected as necessary, it may be difficult to appropriately cope with transmission power required for the characteristics of an applied wireless communications system or a communications environment.

The Related Art Document below relates to a power amplifier, which, however, does not disclose technical matters for selecting a high power mode or a low power mode to reduce power consumption.

RELATED ART DOCUMENT

Japanese Patent Laid-Open Publication No. 2009-200770

SUMMARY OF THE INVENTION

An aspect of the present invention provides a bias circuit and a power amplifier for selecting a required mode among a high power mode and a low power mode.

According to an aspect of the present invention, there is provided a bias circuit including: a regulated voltage generation unit generating a regulated voltage by using a reference voltage; a bias voltage generation unit generating a bias voltage according to the regulated voltage; and a power mode control unit operating in any one of a high power mode and a low power mode according to a power mode voltage and dropping the regulated voltage in the low power mode.

According to another aspect of the present invention, there is provided a power amplifier including: a regulated voltage generation unit generating a regulated voltage by using a reference voltage; a bias voltage generation unit generating a bias voltage according to the regulated voltage; a power mode control unit operating in any one of a high power mode and a low power mode according to a power mode voltage and dropping the regulated voltage in the low power mode; a voltage dropping unit dropping the bias voltage from the bias circuit unit to a base voltage; and an amplifying unit amplifying power of a transmission signal upon receiving the base voltage from the voltage dropping unit.

The regulated voltage generation unit may include: a first resistor and a first temperature compensating transistor connected between an input terminal of the reference voltage and a ground in series, and provide the regulated voltage from a collector of the first temperature compensating transistor.

In the low power mode, the power mode control unit may form a current path from the collector of the first temperature compensating transistor to an output terminal of the bias voltage generation unit to increase a current flowing to the first resistor so as to drop the regulated voltage.

The regulated voltage generation unit may include: a first temperature compensating transistor having a collector connected to an input terminal of the reference voltage through a first resistor, an emitter connected to a ground, and a base; and a second temperature compensating transistor having a collector connected to an operating voltage input terminal, a base connected to the collector of the first temperature compensating transistor, and an emitter connected to a ground through a second resistor, wherein the collector of the first temperature compensating transistor provides the regulated voltage.

The bias voltage generation unit may include: a bias supplying transistor having a collector connected to the operating voltage input terminal, a base connected to the collector of the first temperature compensating transistor, and an emitter connected to an output node of the bias voltage generation unit; and a capacitor connected between the base of the bias supplying transistor and a ground.

The power mode control unit may include: a switching transistor having a collector connected to the operating voltage input terminal, a base receiving the power mode voltage, and an emitter; and a current path transistor having a collector connected to the emitter of the switching transistor, a base connected to the collector of the first temperature compensating transistor, and an emitter connected to the output node of the bias voltage generation unit.

According to the power mode voltage, the current path transistor may be turned on to perform a transistor operation in a turned-on state of the switching transistor, and according to the power mode voltage, a PN junction diode of the base and the emitter of the current path transistor may be turned on in a turned-off state of the switching transistor to form a current path from the collector of the first temperature compensating transistor to the output terminal of the bias voltage generation unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENT

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
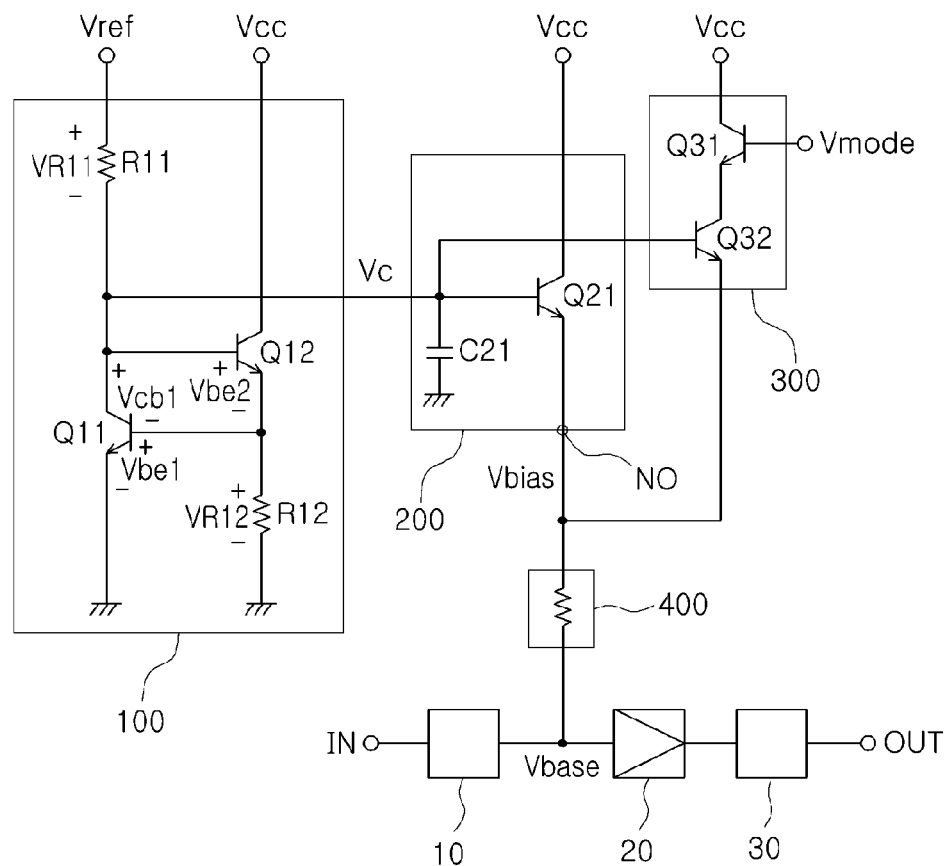
FIG. 1 is a circuit diagram of a bias circuit and a power amplifier according to an embodiment of the present invention.

FIG. 1 is a circuit diagram of a bias circuit and a power amplifier according to an embodiment of the present invention.

Referring to FIG. 1, a bias circuit according to an embodiment of the present invention may include a regulated voltage generation unit 100, a bias voltage generation unit 200, and a power mode control unit 300.

A power amplifier according to an embodiment of the present invention may include the regulated voltage generation unit 100, the bias voltage generation unit 200, the power mode control unit 300, a voltage dropping unit 400, and an amplifying unit 20.

Also, the power amplifier according to an embodiment of the present invention may include an input matching unit 10 connected to an input terminal of the amplifying unit 20 and an output matching unit 30 connected to an output terminal of the amplifying unit 20.

The regulated voltage generation unit 100 may generate a regulated voltage Vc by using a reference voltage Vref.

In an implementation example, the regulated voltage generation unit 100 may include a first resistor R11 and a first temperature compensating transistor Q11 connected between an input terminal of the reference voltage Vref and a ground in series.

Here, the reference voltage Vref is divided into resistance of the first resistor R11 and equivalent resistance of the first temperature compensating transistor Q11, so the regulated voltage Vc may be provided from a collector of the first temperature compensating transistor Q11.

For example, when the reference voltage Vref is 2.9V, the regulated voltage Vc may be 2.6V.

The bias voltage generation unit 200 may generate the bias voltage Vbias according to the regulated voltage Vc. For example, when the regulated voltage Vc is increased, the bias voltage is increased, and when the regulated voltage Vc is decreased, the bias voltage is decreased.

The power mode control unit 300 may operate in one of a high power mode and a low power mode according to a power mode voltage Vmode, and may drop the regulated voltage Vc in the low power mode.

For example, in the low power mode, the power mode control unit 300 may form a current path from the collector of the first temperature compensating transistor Q11 to an output terminal of the bias voltage generation unit 200. When a current further flows along the current path, a current flowing in the first resistor R11 is increased, increasing a both end voltage VR11 of the first resistor R11 to end up with dropping of the regulated voltage Vc.

Accordingly, when the regulated voltage Vc is dropped, the bias voltage Vbias may be dropped by the bias voltage generation unit 200.

The voltage drop unit 400 may drop the bias voltage Vbias from the bias circuit unit 200 to a base voltage and provide the same to the amplifying unit 20.

Upon receiving the base voltage Vbase from the voltage dropping unit 400, the amplifying unit 20 may amplify power of a transmission signal.

Here, the input matching unit 10 performs impedance matching in an input terminal of the amplifying unit 20 to allow an input signal though the input terminal IN to be delivered to the amplifying unit 20 without loss. The output matching unit 30 performs impedance matching in an output terminal of the amplifying unit 20 to allow a signal output from the amplifying unit 20 to be delivered to an output terminal OUT without loss.

Also, referring to FIG. 1, in an implementation example, the regulated voltage generation unit 100 may include the first temperature compensating transistor Q11 having a collector connected to the input terminal of the reference voltage Vref through the first resistor R11, an emitter connected to a ground, and a base, and a second temperature compensating transistor Q12 having a collector connected to an input terminal of an operating voltage Vcc, abase connected to the collector of the first temperature compensating transistor Q11, and an emitter connected to a ground through a second resistor R12.

Here, a base-emitter voltage Vbe1 of the first temperature compensating transistor Q11 is equal to a both end voltage VR12 of the second resistor R12, and a collector-base voltage Vcb1 of the first temperature compensating transistor Q11 is equal to a base-emitter voltage Vbe2 of the second temperature compensating transistor Q12.

Accordingly, the regulated voltage Vc output from the collector of the first temperature compensating transistor Q11 is equal to the sum of the collector-base voltage Vcb1 of the first temperature compensating transistor Q11 and the base-emitter voltage Vbe1 and the sum of the base-emitter voltage Vbe2 of the second temperature compensating transistor Q12 and the both end voltage VR12 of the second resistor R12.

In an implementation example, the bias voltage generation unit 200 may include a bias supplying transistor Q21 having a collector connected to an input terminal of the operating voltage Vcc, abase connected to the collector of the first temperature compensating transistor Q11, and an emitter connected to an output node NO of the bias voltage generation unit 200, and a capacitor C21 connected between the base of the bias supplying transistor Q21 and a ground.

Here, in the bias supplying transistor Q21, a current proportional to a magnitude of the regulated voltage Vc flows between the collector and the emitter of the bias supplying transistor Q21.

The current flowing between the collector and the emitter of the bias supplying transistor Q21 flows through the voltage dropping unit 200, and here, a voltage is dropped in the voltage dropping unit 200. Here, the voltage dropping unit 200 may be configured as a resistor.

In an implementation example, the power mode control unit 300 may include a switching transistor Q31 having a collector connected to an input terminal of the operating voltage Vcc, a base receiving the power mode voltage Vmode, and an emitter, and a current path transistor Q32 having a collector connected to the emitter of the switching transistor Q21, a base connected to the collector of the first temperature compensating transistor Q11, and an emitter connected to the output node NO of the bias voltage generation unit 200.

Figure 2:
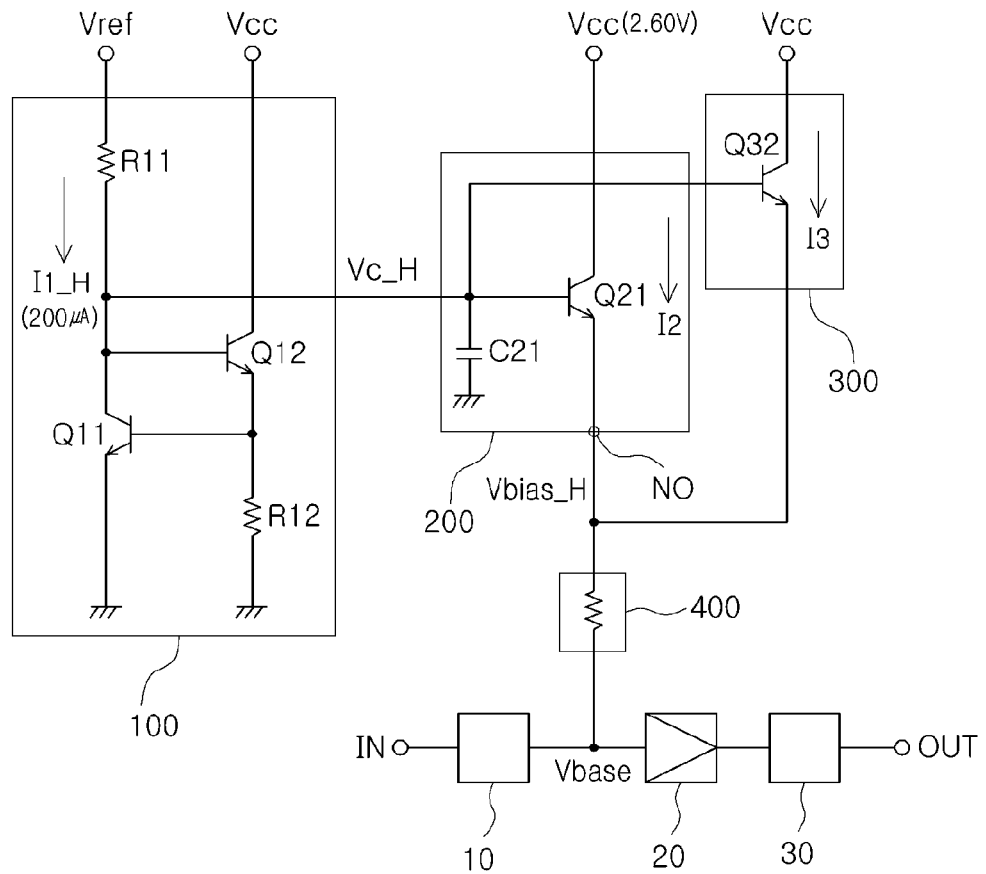
FIG. 2 is a view illustrating a high power mode of the bias circuit and the power amplifier according to an embodiment of the present invention.

FIG. 2 is a view illustrating a high power mode of the bias circuit and the power amplifier according to an embodiment of the present invention.

Referring to FIGS. 1 and 2, when the power mode voltage Vmode is a voltage having a high level, the switching transistor Q31 is turned on and the current path transistor Q32 is also turned on. In this case, since the current path transistor Q32 performs a transistor operation, a current flowing in the collector and the emitter of the current path transistor Q32 is determined by the regulated voltage Vc.

Figure 3:
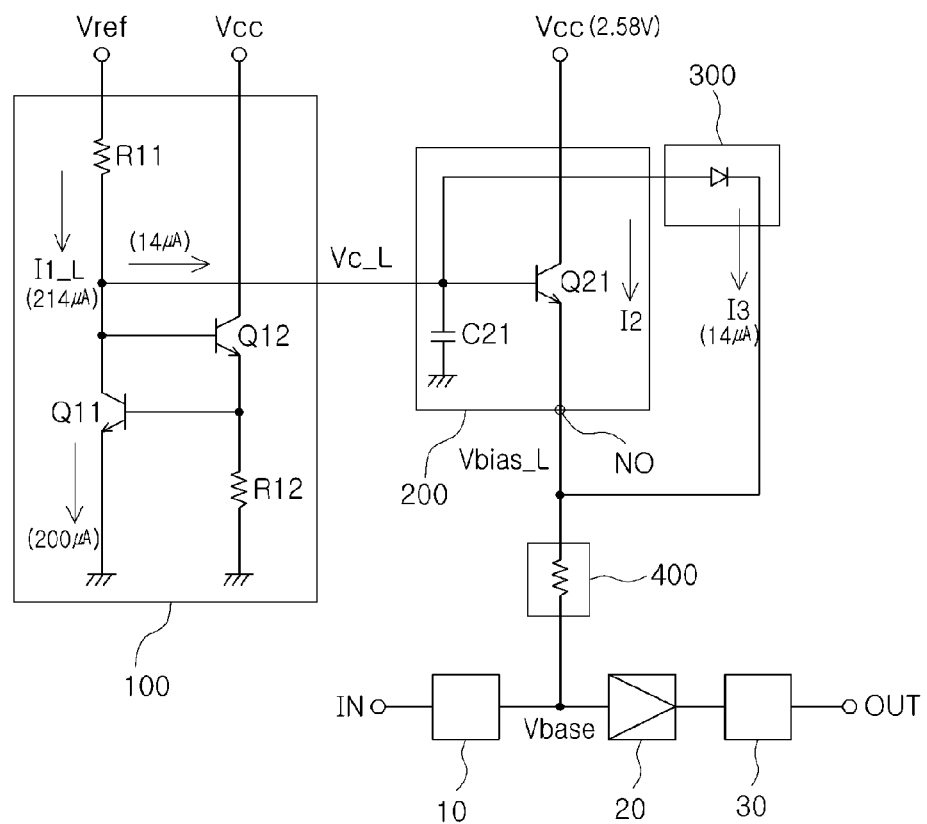
FIG. 3 is a view illustrating a low power mode of the bias circuit and the power amplifier according to an embodiment of the present invention.

FIG. 3 is a view illustrating a low power mode of the bias circuit and the power amplifier according to an embodiment of the present invention.

Referring to FIGS. 1 and 3, when the power mode voltage Vmode is a voltage having a low level, the switching transistor Q31 is turned off, the collector and the emitter of the current path transistor Q32 are turned off and a PN junction diode of the base and the emitter of the current path transistor Q32 is turned on.

Accordingly, a current path is formed from the collector of the first temperature compensating transistor Q11 to the output terminal of the bias voltage generation unit 200 through the PN junction diode of the base and the emitter of the current path transistor Q32.

When a current further flows along the current path, as described above, a current flowing to the first resistor R11 is increased, increasing the both end voltage VR11 of the first resistor R11 to end up with dropping of the regulated voltage Vc.

Thus, when the regulated voltage Vc is dropped, the bias voltage Vbias may also be dropped by the bias voltage generation unit 200.

Figure 4:
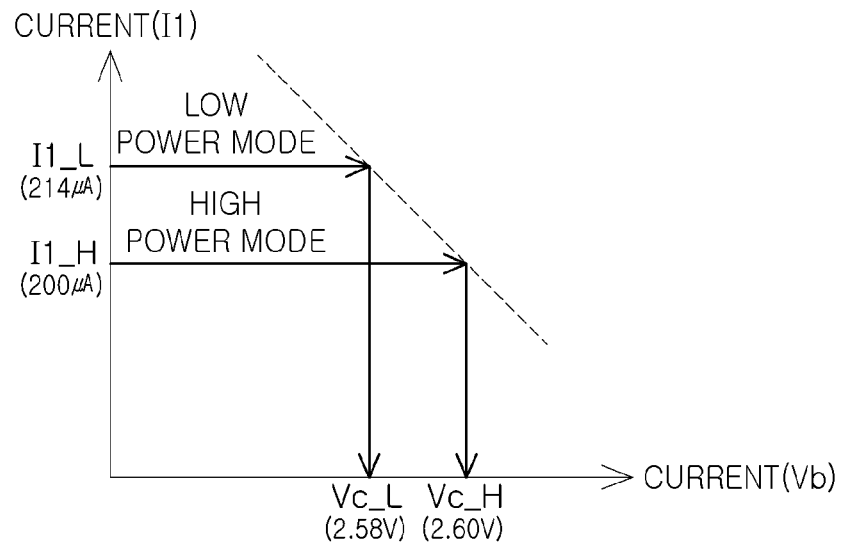
FIG. 4 is a graph showing I1-Vc characteristics according to an embodiment of the present invention.
Figure 5:
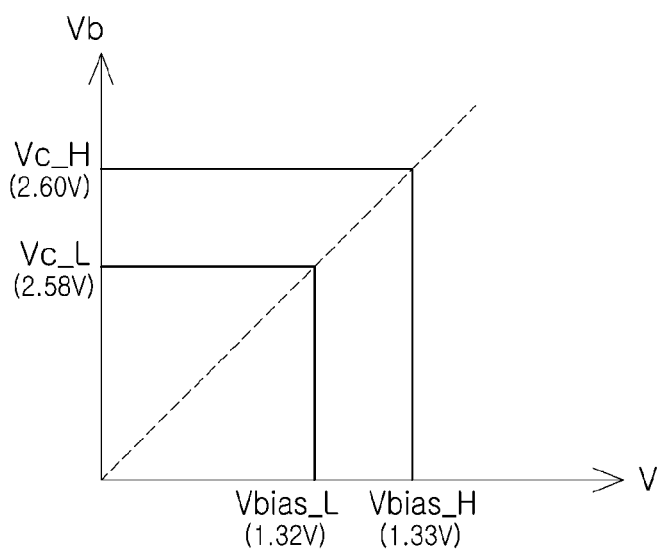
FIG. 5 is a graph showing Vc-Vbias characteristics according to an embodiment of the present invention.

FIG. 4 is a graph showing I1-Vc characteristics according to an embodiment of the present invention, and FIG. 5 is a graph showing Vc-Vbias characteristics according to an embodiment of the present invention.

Referring to FIGS. 2 through 5, for example, in case that the current path transistor Q32 operates as a transistor in a high power mode, when the reference voltage Vref is 2.9V and resistance from the input terminal of the reference voltage Vref to a ground is 14.5 MΩ, a current I1_H flowing in the first temperature compensating transistor Q11 may be 200 μA. Here, when the first resistor R11 is 1.5 kΩ, the both end voltage VR11 of the first resistor R11 is 0.3V and the regulated voltage Vc_H is 2.60V. Accordingly, the bias voltage Vbias_H may be 1.33V.

In comparison, in a low power mode, in case that the current path transistor Q32 operates as a PN junction diode of the base and the emitter thereof, when a current tantamount to 14A, in comparison to the high power mode, further flows along the current path, the current I1_H flowing in the first temperature compensating transistor Q11 may be 214 μA, and in this case, the regulated voltage Vc_H may be 2.58V, and thus, the bias voltage Vbias_H may be 1.32V.

As set forth above, according to the embodiments of the present invention, power mode is classified into a low power mode appropriate for a low output and a high power mode appropriate for a relatively maximum output, and a required one of the high power mode and the low power mode may be selected, whereby power consumption may be reduced in comparison to the case in which relatively maximum output is only used, increasing usage efficiency.

While the present invention has been shown and described in connection with the embodiments, it will be apparent to those skilled in the art that modifications and variations can be made without departing from the spirit and scope of the invention as defined by the appended claims.

What is claimed is:

1. A bias circuit comprising:
    a regulated voltage generation unit generating a regulated voltage by using a reference voltage;
    a bias voltage generation unit generating a bias voltage according to the regulated voltage; and
    a power mode control unit operating in any one of a high power mode and a low power mode according to a power mode voltage and dropping the regulated voltage in the low power mode,
    wherein the regulated voltage generation unit includes:
        a first temperature compensating transistor having a collector connected to an input terminal of the reference voltage through a first resistor, an emitter connected to a ground, and a base; and
        a second temperature compensating transistor having a collector connected to an operating voltage input terminal, a base connected to the collector of the first temperature compensating transistor, and an emitter connected to a ground through a second resistor,
        wherein the collector of the first temperature compensating transistor provides the regulated voltage.

2. The bias circuit of claim 1, wherein the first resistor and the first temperature compensating transistor are connected between the input terminal of the reference voltage and the ground in series.

3. The bias circuit of claim 2, wherein, in the low power mode, the power mode control unit forms a current path from the collector of the first temperature compensating transistor to an output terminal of the bias voltage generation unit to increase a current flowing to the first resistor so as to drop the regulated voltage.

4. The bias circuit of claim 1, wherein the bias voltage generation unit includes:
    a bias supplying transistor having a collector connected to the operating voltage input terminal, a base connected to the collector of the first temperature compensating transistor, and an emitter connected to an output node of the bias voltage generation unit; and
    a capacitor connected between the base of the bias supplying transistor and a ground.

5. The bias circuit of claim 1, wherein the power mode control unit includes:
    a switching transistor having a collector connected to the operating voltage input terminal, a base receiving the power mode voltage, and an emitter; and
    a current path transistor having a collector connected to the emitter of the switching transistor, a base connected to the collector of the first temperature compensating transistor, and an emitter connected to the output node of the bias voltage generation unit.

6. The bias circuit of claim 5, wherein according to the power mode voltage, the current path transistor is turned on to perform a transistor operation in a turned-on state of the switching transistor, and
    according to the power mode voltage, a PN junction diode of the base and the emitter of the current path transistor is turned on in a turned-off state of the switching transistor to form a current path from the collector of the first temperature compensating transistor to the output terminal of the bias voltage generation unit.

7. A power amplifier comprising:
a regulated voltage generation unit generating a regulated voltage by using a reference voltage;
a bias voltage generation unit generating a bias voltage according to the regulated voltage;
a power mode control unit operating in any one of a high power mode and a low power mode according to a power mode voltage and dropping the regulated voltage in the low power mode;
a voltage dropping unit dropping the bias voltage from the bias circuit unit to a base voltage; and
an amplifying unit amplifying power of a transmission signal upon receiving the base voltage from the voltage dropping unit,
wherein the regulated voltage generation unit includes:
a first temperature compensating transistor having a collector connected to an input terminal of the reference voltage through a first resistor, an emitter connected to a ground, and a base, and
a second temperature compensating transistor having a collector connected to an operating voltage input terminal, a base connected to the collector of the first temperature compensating transistor, and an emitter connected to a ground through a second resistor,
wherein the collector of the first temperature compensating transistor provides the regulated voltage.

8. The power amplifier of claim 7, wherein the first resistor and the first temperature compensating transistor are connected between the input terminal of the reference voltage and the ground in series.

9. The power amplifier of claim 8, wherein, in the low power mode, the power mode control unit forms a current path from the collector of the first temperature compensating transistor to an output terminal of the bias voltage generation unit to increase a current flowing to the first resistor so as to drop the regulated voltage.

10. The power amplifier of claim 7, wherein the bias voltage generation unit includes:
a bias supplying transistor having a collector connected to the operating voltage input terminal, a base connected to the collector of the first temperature compensating transistor, and an emitter connected to an output node of the bias voltage generation unit; and
a capacitor connected between the base of the bias supplying transistor and a ground.

11. The power amplifier of claim 7, wherein the power mode control unit includes:
a switching transistor having a collector connected to the operating voltage input terminal, a base receiving the power mode voltage, and an emitter; and
a current path transistor having a collector connected to the emitter of the switching transistor, a base connected to the collector of the first temperature compensating transistor, and an emitter connected to the output node of the bias voltage generation unit.

12. The power amplifier of claim 11, wherein according to the power mode voltage, the current path transistor is turned on to perform a transistor operation in a turned-on state of the switching transistor, and
according to the power mode voltage, a PN junction diode of the base and the emitter of the current path transistor is turned on in a turned-off state of the switching transistor to form a current path from the collector of the first temperature compensating transistor to the output terminal of the bias voltage generation unit.

\* \* \* \* \*